US010489076B2

United States Patent
Ki

(10) Patent No.: US 10,489,076 B2
(45) Date of Patent: *Nov. 26, 2019

(54) MORPHIC STORAGE DEVICE

(71) Applicant: Samsung Electronics Co., Ltd., Suwon-si, Gyeonggi-do (KR)

(72) Inventor: Yang Seok Ki, Palo Alto, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/053,686

(22) Filed: Aug. 2, 2018

(65) Prior Publication Data

US 2018/0341418 A1    Nov. 29, 2018

Related U.S. Application Data

(63) Continuation-in-part of application No. 15/242,433, filed on Aug. 19, 2016, now Pat. No. 10,055,159.

(Continued)

(51) Int. Cl.
*G06F 3/06* (2006.01)
*G06F 11/07* (2006.01)
(Continued)

(52) U.S. Cl.
CPC .......... *G06F 3/0631* (2013.01); *G06F 3/0604* (2013.01); *G06F 3/0616* (2013.01);
(Continued)

(58) Field of Classification Search
CPC ....... G11C 16/10; G11C 16/14; G11C 16/349; G11C 16/3459; G11C 16/3495;
(Continued)

(56) References Cited

U.S. PATENT DOCUMENTS 8,433,985 B2   4/2013  Kwok et al.
8,464,143 B2   6/2013  Olson
(Continued)

OTHER PUBLICATIONS

Cai, et al., Flash Correct-and Refresh: Retention-Aware Error Management for Increased Flash Memory Lifetime, DSSC, Department of Electrical and Computer Engineering, Carnegie Mellon University, © 2012 IEEE, pp. 94-101.

(Continued)

*Primary Examiner* — Shelly A Chase
(74) *Attorney, Agent, or Firm* — Lewis Roca Rothgerber Christie LLP

(57) ABSTRACT

A solid state drive with a capability to select physical flash memory blocks and erasure and programming methods according to requirements of an application using storage in the solid state drive. A wear-out tracker in the solid state drive counts programming and erase cycles, and a raw bit error rate tracker in the solid state drive monitors raw bit errors in data read from the solid state drive. The application provides, to the solid state drive, requirements on an allowable retention time, corresponding to the anticipated storage time of data stored by the application, and on an average response time corresponding to programming and read times for the flash memory. The solid state drive identifies physical flash memory blocks suitable for meeting the requirements, and allocates storage space to the application from among the identified physical flash memory blocks.

20 Claims, 20 Drawing Sheets

Related U.S. Application Data

(60) Provisional application No. 62/352,509, filed on Jun. 20, 2016.

(51) Int. Cl.
| | |
|---|---|
| *G06F 11/10* | (2006.01) |
| *G11C 29/52* | (2006.01) |
| *G11C 29/50* | (2006.01) |
| *G06F 12/02* | (2006.01) |

(52) U.S. Cl.
CPC .......... *G06F 3/0619* (2013.01); *G06F 3/0679* (2013.01); *G06F 11/1048* (2013.01); *G06F 11/1068* (2013.01); *G06F 12/0246* (2013.01); *G11C 29/50* (2013.01); *G11C 29/50004* (2013.01); *G11C 29/52* (2013.01); *G06F 3/0665* (2013.01); *G06F 2212/7209* (2013.01); *G06F 2212/7211* (2013.01)

(58) Field of Classification Search
CPC ..... G11C 29/04; G11C 29/50; G06F 11/1068; G06F 3/0619; G06F 3/0631; G06F 3/0635; G06F 3/0679; G06F 3/0611; G06F 3/0616; G06F 3/064; G06F 11/079; G06F 11/073; G06F 11/076
See application file for complete search history.

(56) References Cited

U.S. PATENT DOCUMENTS

| | | |
|---|---|---|
| 8,489,855 B2 | 7/2013 | Schuette |
| 8,862,810 B2 | 10/2014 | Lee et al. |
| 9,007,842 B2 | 4/2015 | Chen et al. |
| 9,122,589 B1 | 9/2015 | Bono et al. |
| 9,170,933 B2 | 10/2015 | Cideciyan et al. |
| 9,195,401 B2 | 11/2015 | Li et al. |
| 2013/0326284 A1* | 12/2013 | Losh .................. G06F 11/2053 714/47.2 |
| 2014/0215129 A1 | 7/2014 | Kuzmin et al. |
| 2015/0286528 A1 | 10/2015 | Cai et al. |
| 2016/0170871 A1 | 6/2016 | Hyun et al. |
| 2016/0179602 A1 | 6/2016 | Gorobets et al. |
| 2016/0315635 A1 | 10/2016 | Cai et al. |
| 2017/0160338 A1* | 6/2017 | Connor .................. G11C 7/00 |

OTHER PUBLICATIONS

Liu, et al., Optimizing NAND Flash-Based SSDs via Retention Relaxation, National Taiwan University and Intel Corporation, Feb. 2012, 14 sheets.

Cai, et. al, Error Patterns in MLC NAND Flash Memory: Measurement, Characterization, and Analysis, © 2012 EDAA, 6 sheets.

U.S. Office Action dated Jan. 2, 2019, issued in U.S. Appl. No. 16/045,639 (8 pages).

* cited by examiner

MORPHIC STORAGE DEVICE

CROSS-REFERENCE TO RELATED APPLICATION(S)

The present application is a continuation in part of U.S. patent application Ser. No. 15/242,433, filed Aug. 19, 2016, entitled "MORPHIC STORAGE DEVICE" which claims priority to and the benefit of U.S. Provisional Application No. 62/352,509, filed Jun. 20, 2016, entitled "MORPHIC STORAGE DEVICE", the entire content of which is incorporated herein by reference.

FIELD

One or more aspects of embodiments according to the present invention relate to flash memory, and more particularly to a system and method for adjusting the operation of a flash memory device to suit various circumstances.

BACKGROUND

Flash memory is a form of persistent storage in which the retention time of data may depend on various factors. For example, the retention time of data in a flash memory cell may depend on the number of program and erase cycles the cell has experienced, the method of erase used, and the method of programming used. Various applications using flash memory may have different requirements, with, for example, some applications requiring very long retention times, and other applications requiring only short retention times. For applications requiring only short retention times, operating the flash memory in a manner that provides long retention times may not be advantageous, resulting, e.g., in degraded performance.

Thus, there is a need for a system and method for adjusting the operation of a flash memory device to suit various circumstances.

SUMMARY

Aspects of embodiments of the present disclosure are directed toward a solid state drive with a capability to select physical flash memory blocks, and erasure and programming methods according to requirements of an application using storage in the solid state drive. A wear-out tracker in the solid state drive counts erase and programming cycles, and a raw bit error rate tracker in the solid state drive monitors raw bit errors in data read from the solid state drive. The application provides, to the solid state drive, requirements on an allowable retention time, corresponding to the anticipated storage time of data stored by the application, and on an average response time, corresponding to programming and read times for the flash memory. The solid state drive identifies physical flash memory blocks suitable for meeting the requirements, and allocates storage space to the application from among the identified physical flash memory blocks.

According to an embodiment of the present invention there is provided a method for allocating portions of a flash memory in a solid state drive connected to a host, the flash memory including a plurality of physical flash memory blocks, the method including: performing a plurality of read operations on the flash memory, one or more read operations including an error correcting code decoding operation, the error correcting code decoding operation producing a bit error count; calculating, from a plurality of bit error counts, a raw bit error rate for one or more of the plurality of physical flash memory blocks; counting programming and erase cycles performed for each of the plurality of physical flash memory blocks; calculating, for one or more physical flash memory blocks, from the raw bit error rate and the number of programming and erase cycles, for each of a plurality of programming methods: an average response time, and an estimated allowable retention time; receiving, from a first application executing on the host, a first set of requirements; determining, for one or more physical flash memory blocks, whether it is suitable for meeting the first set of requirements; forming a first list of physical flash memory blocks, the physical flash memory blocks in the first list being suitable for meeting the first set of requirements; receiving a request for an allocation of storage space from the first application; and allocating, to the application, a first physical flash memory block from the first list.

In one embodiment, the plurality of programming methods includes: an incremental step pulse programming method utilizing a first step size; and an incremental step pulse programming method utilizing a second step size, the first step size being greater than the second step size.

In one embodiment, the first set of requirements includes a required allowable retention time and a required average response time.

In one embodiment, the determining, for one or more physical flash memory blocks, whether it is suitable for meeting the first set of requirements includes determining whether for any programming method of the plurality of programming methods: the calculated average response time is less than the required average response time; and the calculated estimated allowable retention time is greater than the required allowable retention time.

In one embodiment, the method includes erasing the first physical flash memory block.

In one embodiment, the erasing of the first physical flash memory block includes: employing a shallow erase process when the predicted effect of a shallow erase process is that the first physical flash memory block remains suitable for meeting the first set of requirements; and employing a normal erase process when the predicted effect of a shallow erase process is that the first physical flash memory block does not remain suitable for meeting the first set of requirements.

In one embodiment, the calculating, for one or more physical flash memory blocks, of an estimated allowable retention time includes performing a linear fit to bit error counts as a function of retention time and calculating the retention time for which the linear fit exceeds a maximum acceptable raw bit error rate.

In one embodiment, the maximum acceptable raw bit error rate is one bit error per million bits.

In one embodiment, the method includes: receiving, from a second application executing on the host, a second set of requirements different from the first set of requirements; determining, for one or more physical flash memory blocks, whether it is suitable for meeting the second set of requirements; forming a second list of physical flash memory blocks, the physical flash memory blocks in the second list being suitable for meeting the second set of requirements; receiving a request for an allocation of storage space from the second application; and allocating, to the application, a second physical flash memory block from the second list.

In one embodiment, the method includes erasing the second physical flash memory block.

In one embodiment, the erasing of the second physical flash memory block includes: employing a shallow erase process when the predicted effect of a shallow erase process is that the first physical flash memory block remains suitable for meeting the first set of requirements; and employing a normal erase process when the predicted effect of a shallow erase process is that the first physical flash memory block does not remain suitable for meeting the first set of requirements.

According to an embodiment of the present invention there is provided a solid state drive, including: a storage controller, the storage controller including a processing unit; and a flash memory, including a plurality of physical flash memory blocks, each physical flash memory block including a plurality of physical pages, the storage controller including: a morphic engine including: a NAND controller; a retention predictor; a wear-out tracker; and a raw bit error rate tracker; and a storage virtualizer including: a virtual storage table; an address translation block; and a clustering engine; the NAND controller being configured to perform a plurality of read operations on the flash memory, one or more read operations including an error correcting code decoding operation, the error correcting code decoding operation producing a bit error count; the raw bit error rate tracker being configured to calculate, from a plurality of bit error counts, a raw bit error rate for one or more of the plurality of physical flash memory blocks; the wear-out tracker being configured to count programming and erase cycles performed for one or more of the plurality of physical flash memory blocks; the clustering engine being configured to calculate, for one or more physical flash memory blocks, from the raw bit error rate and the number of programming and erase cycles for each of a plurality of programming methods: an average response time, and an estimated allowable retention time; the virtual storage table being configured to receive, from a first application executing on the host, a first set of requirements; the clustering engine being configured to receive the first set of requirements from the virtual storage table, and to determine, for one or more physical flash memory blocks, whether it is suitable for meeting the first set of requirements; the clustering engine being configured to form a first list of physical flash memory blocks, the physical flash memory blocks in the first list being suitable for meeting the first set of requirements; the clustering engine being configured to receive a request for an allocation of storage space from the first application; and the clustering engine being configured to allocate, to the application, a first physical flash memory block from the first list.

In one embodiment, the plurality of programming methods includes: an incremental step pulse programming method utilizing a first step size; and an incremental step pulse programming method utilizing a second step size, the first step size being greater than the second step size.

In one embodiment, the first set of requirements includes a required allowable retention time and a required average response time.

In one embodiment, the determining, for one or more physical flash memory blocks, whether it is suitable for meeting the first set of requirements includes determining whether for any programming method of the plurality of programming methods: the calculated average response time is less than the required average response time; and the calculated estimated allowable retention time is greater than the required allowable retention time.

In one embodiment, the NAND controller is further configured to erase the first physical flash memory block.

In one embodiment, the erasing of the first physical flash memory block includes: employing a shallow erase process when the predicted effect of a shallow erase process is that the first physical flash memory block remains suitable for meeting the first set of requirements; and employing a normal erase process when the predicted effect of a shallow erase process is that the first physical flash memory block does not remain suitable for meeting the first set of requirements.

In one embodiment, the calculating, for one or more physical flash memory blocks, of an estimated allowable retention time as a function of a performance metric includes performing a linear fit to bit error counts as a function of retention time and calculating the retention time for which the linear fit exceeds a maximum acceptable raw bit error rate.

In one embodiment, the maximum acceptable raw bit error rate is one bit error per million bits.

In one embodiment, the virtual storage table is further configured to receive, from a second application executing on the host, a second set of requirements different from the first set of requirements; the clustering engine is further configured to: receive the second set of requirements from the virtual storage table, and to determine, for one or more physical flash memory blocks, whether it is suitable for meeting the second set of requirements; form a second list of physical flash memory blocks, the physical flash memory blocks in the second list being suitable for meeting the second set of requirements; receive a request for an allocation of storage space from the second application; and allocate, to the application, a second physical flash memory block from the second list.

According to an embodiment of the present invention there is provided a method for allocating portions of a flash memory in a solid state drive connected to a host, the flash memory comprising a plurality of physical flash memory blocks, the method including: counting programming and erase cycles performed for each of the plurality of physical flash memory blocks; calculating, for one or more physical flash memory blocks, from a raw bit error rate and the number of programming and erase cycles, for each of a plurality of programming methods: an average response time, and an estimated allowable retention time; receiving, from a first application executing on the host, a first set of requirements; determining, for one or more physical flash memory blocks, whether it is suitable for meeting the first set of requirements; receiving a request for an allocation of storage space from the first application; and allocating, to the first application, a first physical flash memory block that is suitable for meeting the first set of requirements.

In one embodiment, the method for allocating portions of a flash memory further includes: performing a plurality of read operations on the flash memory, one or more read operations comprising an error correcting code decoding operation, the error correcting code decoding operation producing a bit error count; and calculating, from a plurality of bit error counts, the raw bit error rate for one or more of the plurality of physical flash memory blocks.

In one embodiment, the method for allocating portions of a flash memory further includes: forming a first list of physical flash memory blocks, the physical flash memory blocks in the first list being suitable for meeting the first set of requirements, wherein allocating, to the first application, the first physical flash memory block that is suitable for meeting the first set of requirements comprises, allocating, to the first application, the first physical flash memory block from the first list.

In one embodiment, the method for allocating portions of a flash memory further includes: receiving, from a second application executing on the host, a second set of requirements different from the first set of requirements; determining, for one or more physical flash memory blocks, whether it is suitable for meeting the second set of requirements; forming a second list of physical flash memory blocks, the physical flash memory blocks in the second list being suitable for meeting the second set of requirements; receiving a request for an allocation of storage space from the second application; and allocating, to the second application, a second physical flash memory block from the second list.

In one embodiment, the plurality of programming methods includes: a first programming voltage; and a second programming voltage, the second programming voltage being greater than the first programming voltage.

In one embodiment, the first set of requirements includes a required allowable retention time or a required average response time.

In one embodiment, the determining, for one or more physical flash memory blocks, whether it is suitable for meeting the first set of requirements comprises determining whether for any programming method of the plurality of programming methods: the calculated average response time is less than the required average response time; and the calculated estimated allowable retention time is greater than the required allowable retention time.

In one embodiment, the method for allocating portions of a flash memory further includes improving at least one of the average response time or the estimated allowable retention time by performing data protection on at least one of the plurality of physical flash memory blocks.

In one embodiment, performing data protection comprises performing according to one of a redundant array of independent disks (RAID) configuration or an erasure coding configuration.

In one embodiment, the method for allocating portions of a flash memory further includes improving at least one of the average response time or the estimated allowable retention time by reducing an overall capacity of the solid state drive by removing at least one of the plurality of physical flash memory blocks from usage.

According to an embodiment of the present invention there is provided a solid state drive, including: a storage controller, the storage controller comprising a hardware processing circuit; and a flash memory, including a plurality of physical flash memory blocks, each physical flash memory block comprising a plurality of physical pages, the storage controller including: a morphic engine having: a NAND controller; a retention predictor; a wear-out tracker; a raw bit error rate tracker; and a data protection controller; and a storage virtualizer having: an address translation block; and a clustering engine; the raw bit error rate tracker being configured to calculate, from a plurality of bit error counts, a raw bit error rate for one or more of the plurality of physical flash memory blocks; the wear-out tracker being configured to count programming and erase cycles performed for one or more of the plurality of physical flash memory blocks;

the clustering engine being configured to calculate, for one or more physical flash memory blocks, from the raw bit error rate and the number of programming and erase cycles for each of a plurality of programming methods: an average response time, and an estimated allowable retention time; the data protection controller being configured to improve at least one of the average response time or the estimated allowable retention time by implementing a data protection scheme; the clustering engine being configured to receive a first set of requirements, and to determine, for one or more physical flash memory blocks, whether it is suitable for meeting the first set of requirements; the clustering engine being configured to receive a request for an allocation of storage space from the first application; and the clustering engine being configured to allocate, to the first application, a first physical flash memory block that is suitable for meeting the first set of requirements.

In one embodiment, the NAND controller is configured to perform a plurality of read operations on the flash memory, one or more read operations comprising the error correcting code decoding operation, the error correcting code decoding operation producing the bit error count.

In one embodiment, the clustering engine is configured to form a first list of physical flash memory blocks, the physical flash memory blocks in the first list being suitable for meeting the first set of requirements, and is configured to allocate, to the first application, the first physical flash memory block that is from the first list.

In one embodiment, the storage virtualizer further includes a virtual storage table, the virtual storage table being configured to receive, from a first application executing on the host, the first set of requirements for a first data stream, and wherein the clustering engine being configured to receive the first set of requirements from the virtual storage table.

In one embodiment, the virtual storage table is further configured to receive, from the first application executing on the host, a second set of requirements different from the first set of requirements associated with a first application stream; the clustering engine is further configured to: receive the second set of requirements from the virtual storage table, and to determine, for one or more physical flash memory blocks, whether it is suitable for meeting the second set of requirements; form a second list of physical flash memory blocks, the physical flash memory blocks in the second list being suitable for meeting the second set of requirements; receive a request for an allocation of storage space from the first application; and allocate, to the first application, a second physical flash memory block from the second list.

In one embodiment, the plurality of programming methods includes: a first programming voltage; and a second programming voltage, the second programming voltage being greater than the first programming voltage.

In one embodiment, the first set of requirements includes a required allowable retention time or a required average response time.

In one embodiment, the determining, for one or more physical flash memory blocks, whether it is suitable for meeting the first set of requirements comprises determining whether for any programming method of the plurality of programming methods: the calculated average response time is less than the required average response time; and the calculated estimated allowable retention time is greater than the required allowable retention time.

In one embodiment, the data protection controller is configured to provide one of redundant array of independent disks (RAID) operation or an erasure coding operation to at least one physical flash memory block of the plurality of physical flash memory blocks.

In one embodiment, the morphic engine is further configured to improve at least one of the average response time or the estimated allowable retention time by reducing an overall capacity of the solid state drive by removing at least one of the plurality of physical flash memory blocks from usage.

BRIEF DESCRIPTION OF THE DRAWINGS

These and other features and advantages of the present invention will be appreciated and understood with reference to the specification, claims, and appended drawings wherein:

DETAILED DESCRIPTION

The detailed description set forth below in connection with the appended drawings is intended as a description of example embodiments of a morphic storage device provided in accordance with the present invention, and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Flash memory devices such as solid state drives are persistent memory storage devices having characteristics that differ in some respects from other persistent memory devices such as hard disk drives. In flash memory, charge on a floating gate may be used to store information, and the charge may, over time, leak off of the floating gate, resulting in loss or partial loss of the stored information. Moreover, the degree to which data is lost over time depends on a number of factors.

Figure 1A:
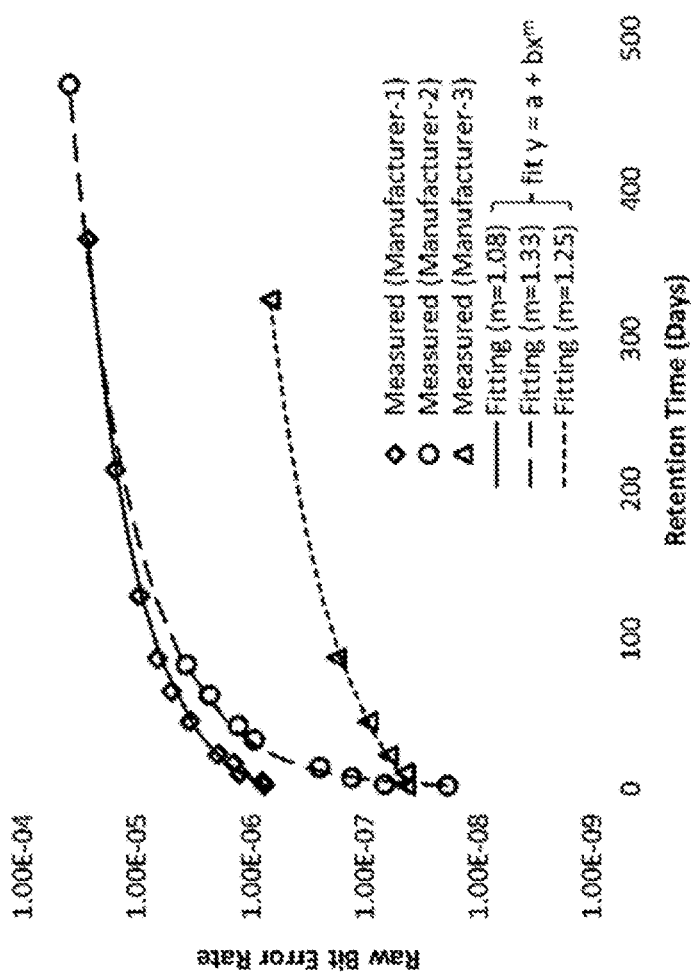
FIG. 1A is a graph of raw bit error rate as a function of retention time.

Referring to FIG. 1A, the raw bit error rate in data read from a flash memory may depend as shown on the retention time, i.e., the time between when the data were written and when they were read. The bit error rate may also depend on the nature of the device, with devices made by different manufacturers showing different error rates as a function of retention time.

Figure 1B:
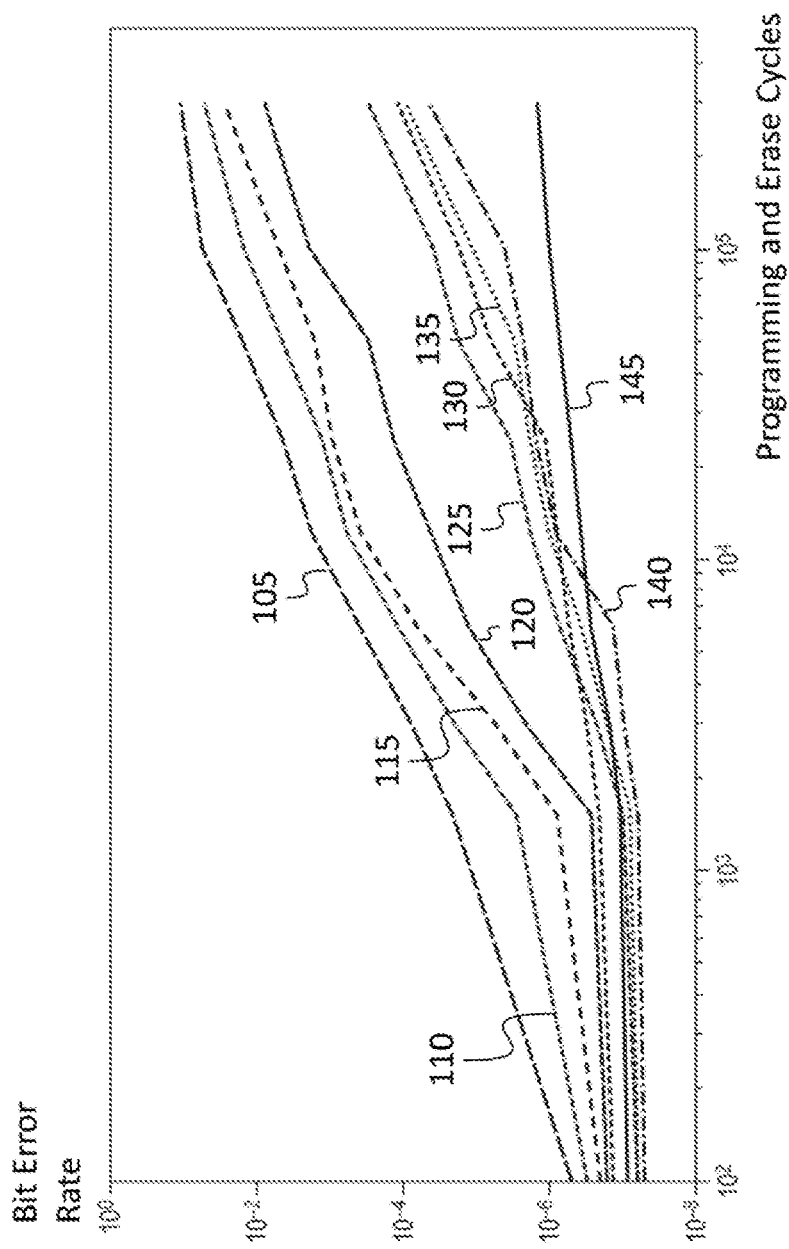
FIG. 1B is a graph of raw bit error rate as a function of number of programming and erase cycles.

Referring to FIG. 1B, the raw bit error rate may depend not only on the retention time, but also on the number of programming and erase cycles to which the flash memory has been subjected, with the ability of the flash memory to store data over longer periods of time degrading with an increased number of programming and erase cycles. In FIG. 1B, a curve 105 shows 3-year retention errors, a curve 110 shows 1-year retention errors, a curve 115 shows 3-month retention errors, a curve 120 shows 3-week retention errors, a curve 125 shows 3-day retention errors, a curve 130 shows program interference errors, a curve 135 shows 1-day retention errors, a curve 140 shows read errors, and a curve 145 shows erase errors.

Figure 2A:
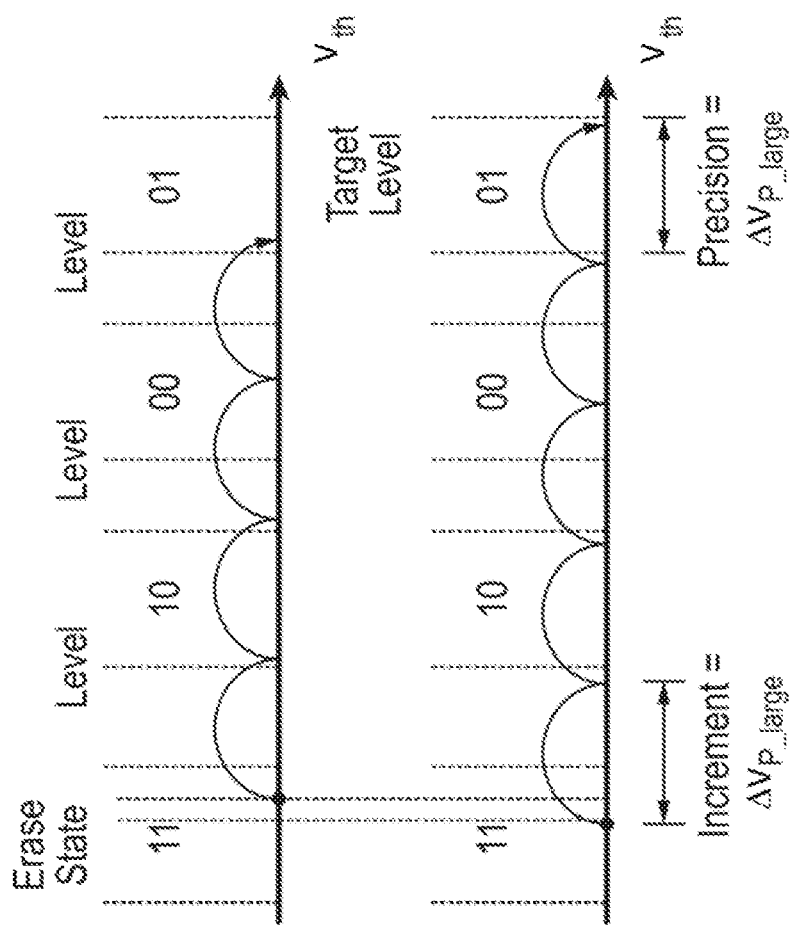
FIG. 2A is a voltage step sequence diagram, according to an embodiment of the present invention.
Figure 2B:
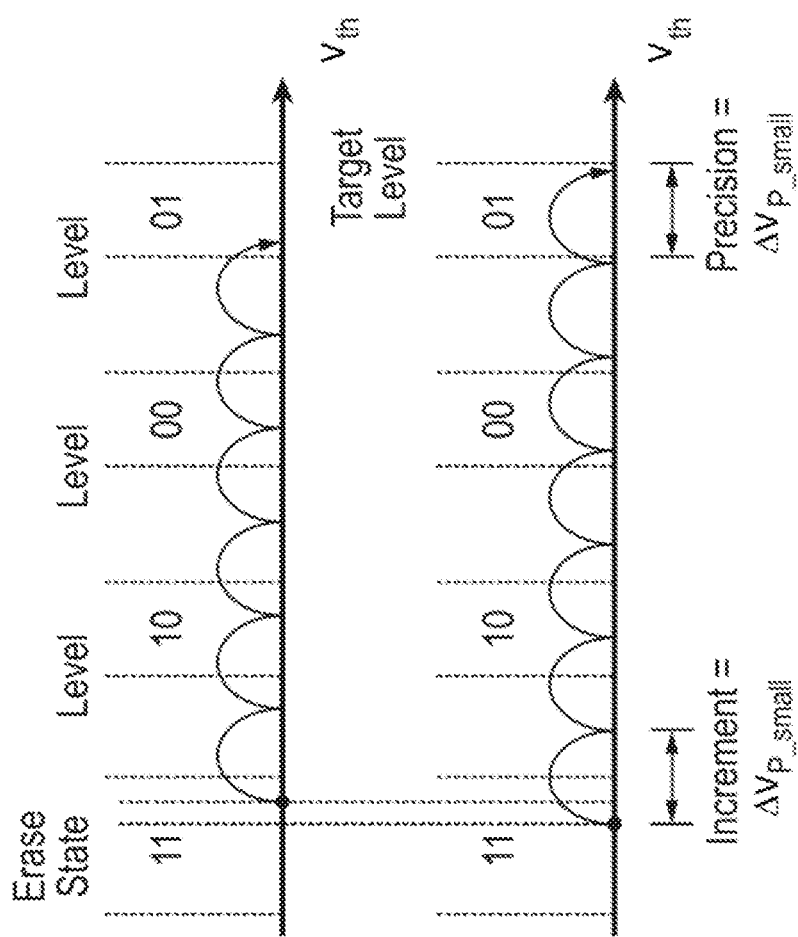
FIG. 2B is a voltage step sequence diagram, according to an embodiment of the present invention.

Referring to FIGS. 2A and 2B, when incremental step pulse programming (ISPP) is used, the step size used for programming may affect the precision with which charge can be placed on the floating gate. Accordingly, the smaller the step size used, the lower the raw bit error rate, all other factors being equal. The use of a smaller step size may however result in the programming operation taking longer to complete.

Figure 3A:
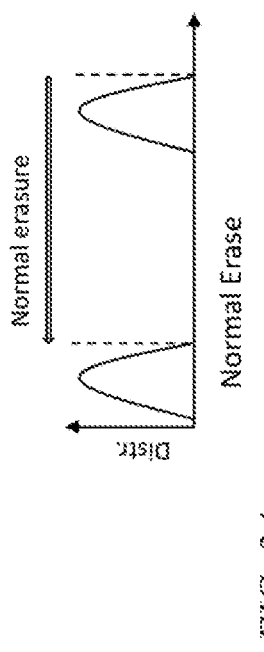
FIG. 3A is a graph of voltage distributions for a programmed state and an erased state, according to an embodiment of the present invention.
Figure 3B:
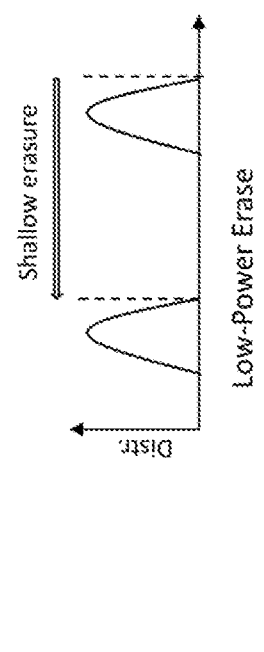
FIG. 3B is a graph of voltage distributions for a programmed state and an erased state, according to an embodiment of the present invention.

Referring to FIGS. 3A and 3B, the use of a shallow erase process to erase the memory (FIG. 3B) may result in a prolonged life span (i.e., a longer allowable retention time, after a large number of programming and erase cycles) compared to a normal erase process (FIG. 3A), the shallow erase process tending to degrade the memory less than the normal erase process. As used herein, the "allowable retention time" is the amount of time that data may be left stored in the flash memory while maintaining an acceptable raw bit error rate. The allowable retention time may depend on the acceptable raw bit error rate; in some embodiments the acceptable raw bit error rate is $10^{-6}$, i.e., one error per million bits. The use of a shallow erase process may however result in a higher bit error rate during any given programming and erase cycle than the use of a normal erase process, for a device with the same history, as the shallow erase process may reduce the range of charge values that can be stored on the floating gate.

Figure 3C:
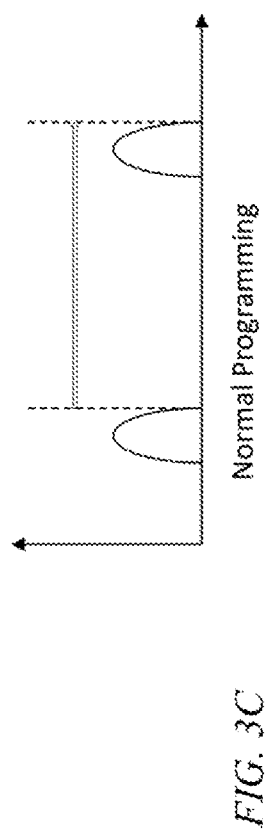
FIG. 3C is a graph of voltage distributions for an erased state and a programmed state, according to an embodiment of the present invention.
Figure 3D:
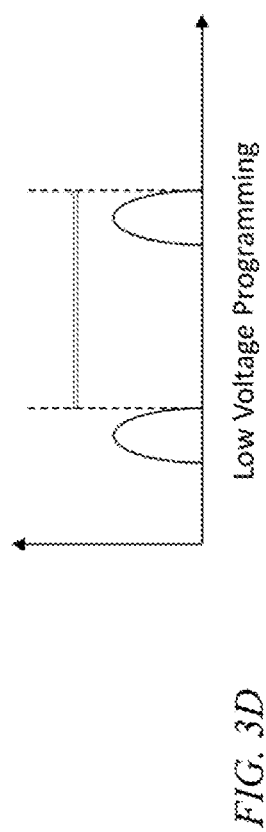
FIG. 3D is a graph of voltage distributions for an erased state and a programmed state, according to an embodiment of the present invention.

Referring to FIGS. 3C and 3D, the use of a lower programming voltage (FIG. 3D) may result in a drive performing at a higher level for a prolonged period of time (i.e., a longer allowable retention time, after a large number of programming and erase cycles) compared to a normal programming voltage (FIG. 3C). In some embodiments, using a relatively low voltage for programming may tend to degrade the memory less than using a normal voltage for programming and improve the lifespan of a drive. However, the use of the low programming voltage may not be possible for some memory. For example, older memory (e.g., more worn out memory cells) may not be able to effectively use the low programming voltage, as accumulated wear (e.g., damage) to the cells makes differentiating between the low-voltage programmed and unprogrammed states difficult. Therefore, when a drive is new or relatively new, a low programming voltage may be used, and as the drive ages, the lower programming voltage may no longer be effective and normal full-voltage programming may be used. Thus, in some embodiments, the programming voltage used may be modified based on a drive's age. As such, the selection of the programming process may be made taking into account the age of the drive and provide a low programming voltage to new or relatively young drives and provides a full programming voltage to older drives.

As such, the selection of programming and erase processes may be made taking into account the retention time requirements that apply and the age/condition of the cells of the drives. For example, some applications, such as Web-caching, may require retention times of only a few days, whereas other applications may require retention times of a year or more. For example, for an application requiring a retention time of only a few days, it may be acceptable to use a physical block of flash memory that has been subjected to a large number of programming and erase cycles, or it may be possible to use incremental step pulse programming with a large step size.

Figure 4:
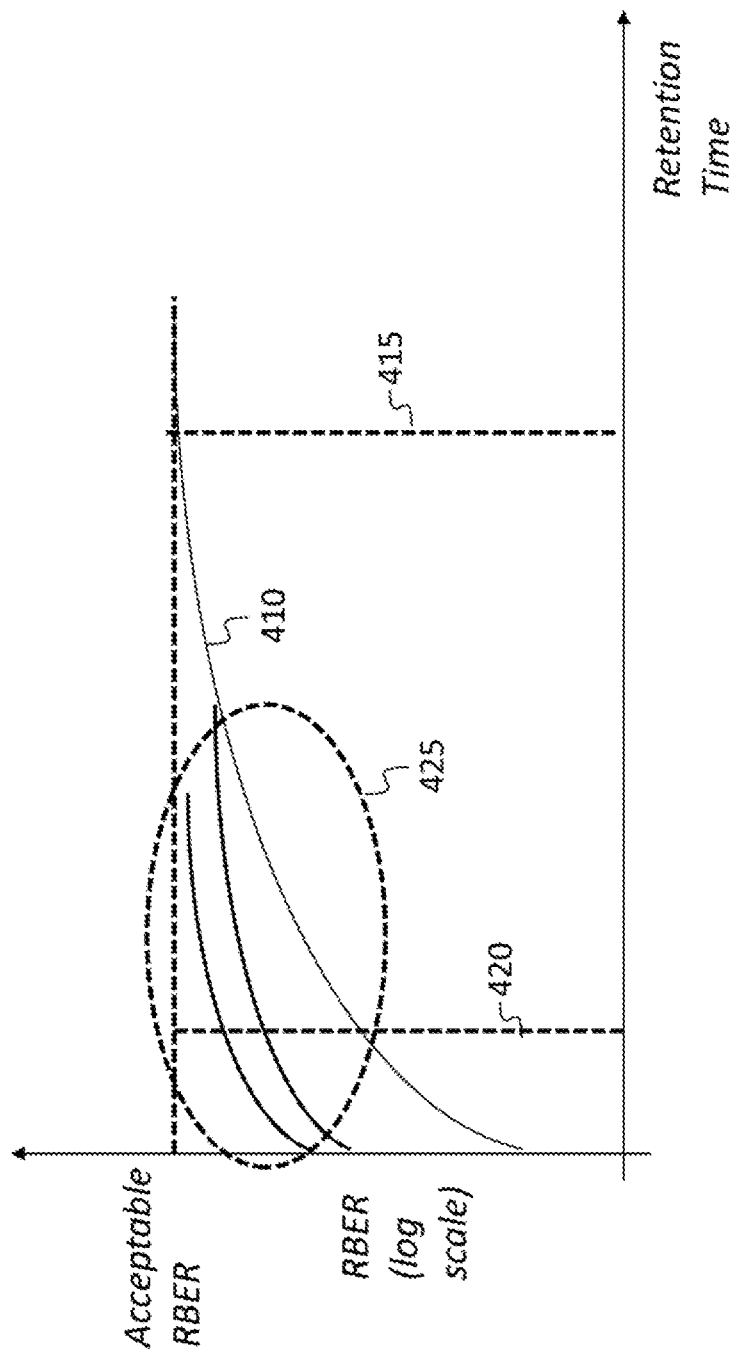
FIG. 4 is a graph of raw bit error rate as a function of retention time, according to an embodiment of the present invention.

Referring to FIG. 4, for example, a physical flash memory block and erase and programming processes (represented by a first raw bit error rate (RBER) curve 410) providing a long allowable retention time 415 may be used for data expected to be left in storage a long time. Data for which a shorter allowable retention time 420 is sufficient may be handled using processes 425 providing a shorter allowable retention time, e.g., shallow erase processes, or incremental step pulse programming with a large step size.

Referring to FIGS. 5A-5D, a persistent storage device such as a hard disk drive (HDD) or a solid state drive may have several relevant characteristics. For example such a device may provide a given level of performance ("Perf.") in terms of throughput or latency, or in terms of the time required to perform a read operation, an erase operation, or a write (or programming) operation. For a solid state drive, the time required to complete an erase operation, or a programming operation may be significantly different (e.g., longer) than the time required to complete a read operation, and an average response time may be used to characterize the performance of the device. This average response time may be calculated from the read time, the erase time and the programming time, and it may take into account the typical ratio of the number of reads for each piece of data written, and the use of mitigating measures, such as buffering, for reducing the impact of long erase and programming times. In some embodiments the average response time is defined as follows: $T_{avg} = (\Sigma_{1=i}^{N_{read}} T_{read\ i} + \Sigma_{1=i}^{N_{write}} T_{write\ i})/(N_{read} + N_{write})$, where $N_{read}$ and $N_{write}$ are the number of reads and writes, respectively, performed by a benchmarking test over a specified period of time, e.g., 10 seconds, and where $T_{read\ i}$ and $T_{write\ i}$ are, respectively, the $i^{th}$ read time and the $i^{th}$ write time during the test.

A device may have a certain life and corresponding age/condition of the cells the drive, which may be determined for a hard disk drive by the rate of wear experienced by moving parts, and for a solid state drive by degradation resulting from programming and erase cycles. A device may have a capacity ("Cap."), i.e., a maximum quantity of data that the device is capable of storing, and an allowable retention time ("Ret."). From FIGS. 5A and 5B it may be seen, for example, that a hard disk drive may have a greater capacity and a greater retention time than a solid state drive, but a shorter life and slower response time (i.e., inferior performance). Similarly from FIGS. 5C and 5D it may be seen that a first application ("app1", FIG. 5D) may have high performance requirements and low retention time requirements compared to default characteristics (FIG. 5C) of the solid state drive, and a second application ("app2", FIG. 5D) may have low performance requirements and high retention time requirements.

Figure 5A:
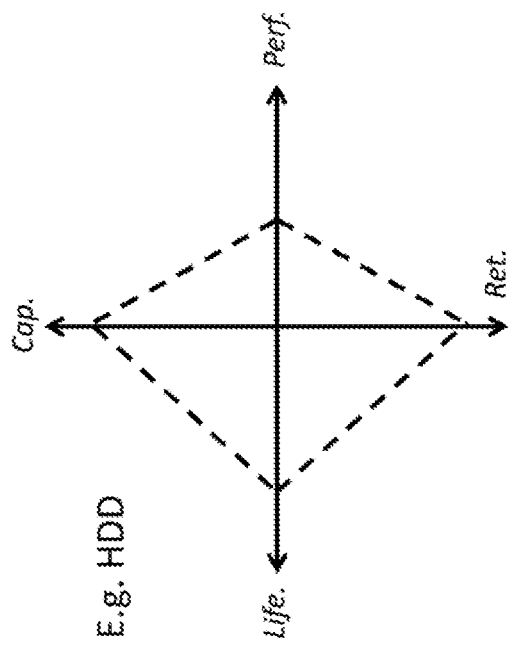
FIG. 5A is a four-axis characteristic diagram for a hard disk drive.
Figure 5B:
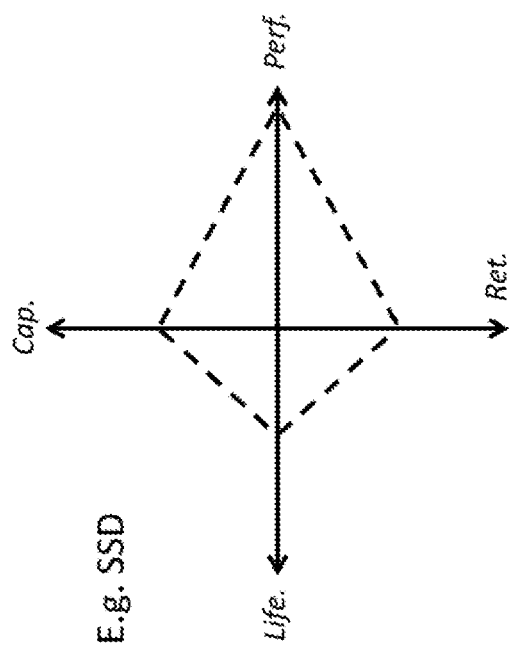
FIG. 5B is a four-axis characteristic diagram for a solid state drive, according to an embodiment of the present invention.
Figure 5C:
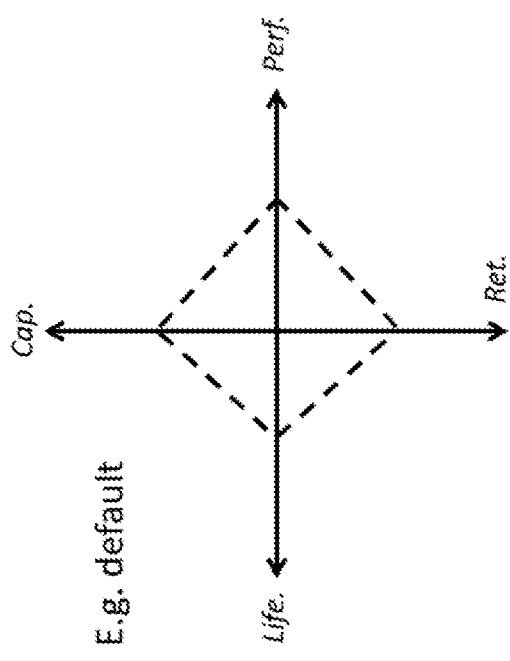
FIG. 5C is a four-axis characteristic diagram for a solid state drive, according to an embodiment of the present invention.
Figure 5D:
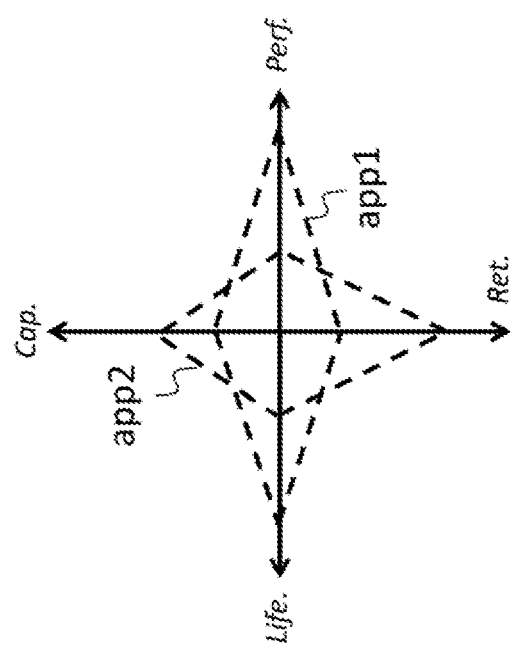
FIG. 5D is a four-axis characteristic diagram for a solid state drive, according to an embodiment of the present invention.
Figure 5E:
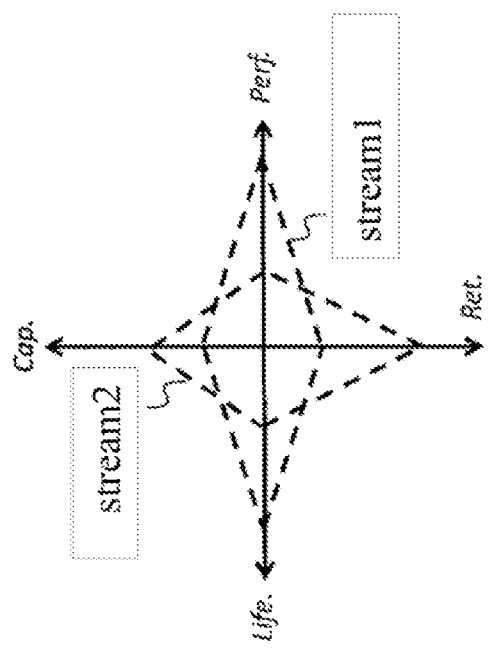
FIG. 5E is a four-axis characteristic diagram for a solid state drive, according to an embodiment of the present invention.

In some instances, an application's performance requirements may be mixed. For example, each application (or operating system) may operate a plurality of I/O streams to a drive, each stream having different performance and retention characteristics. Thus, the application may include a set of requirements that includes multiple subsets of requirements for each I/O data stream. Referring to FIG. 5E, in various embodiments, an application may have multiple I/O streams (e.g., two or more) which may in turn each have different performance requirements. For example, it may be seen that a first application stream ("stream1", FIG. 5E) may have a first subset of requirements that are relatively high performance requirements and low retention time requirements compared to default characteristics (FIG. 5C) of the solid state drive, and a second application stream ("stream2", FIG. 5E) may have a second subset of requirements that are relatively low performance requirements and high retention time requirements.

Figure 6:
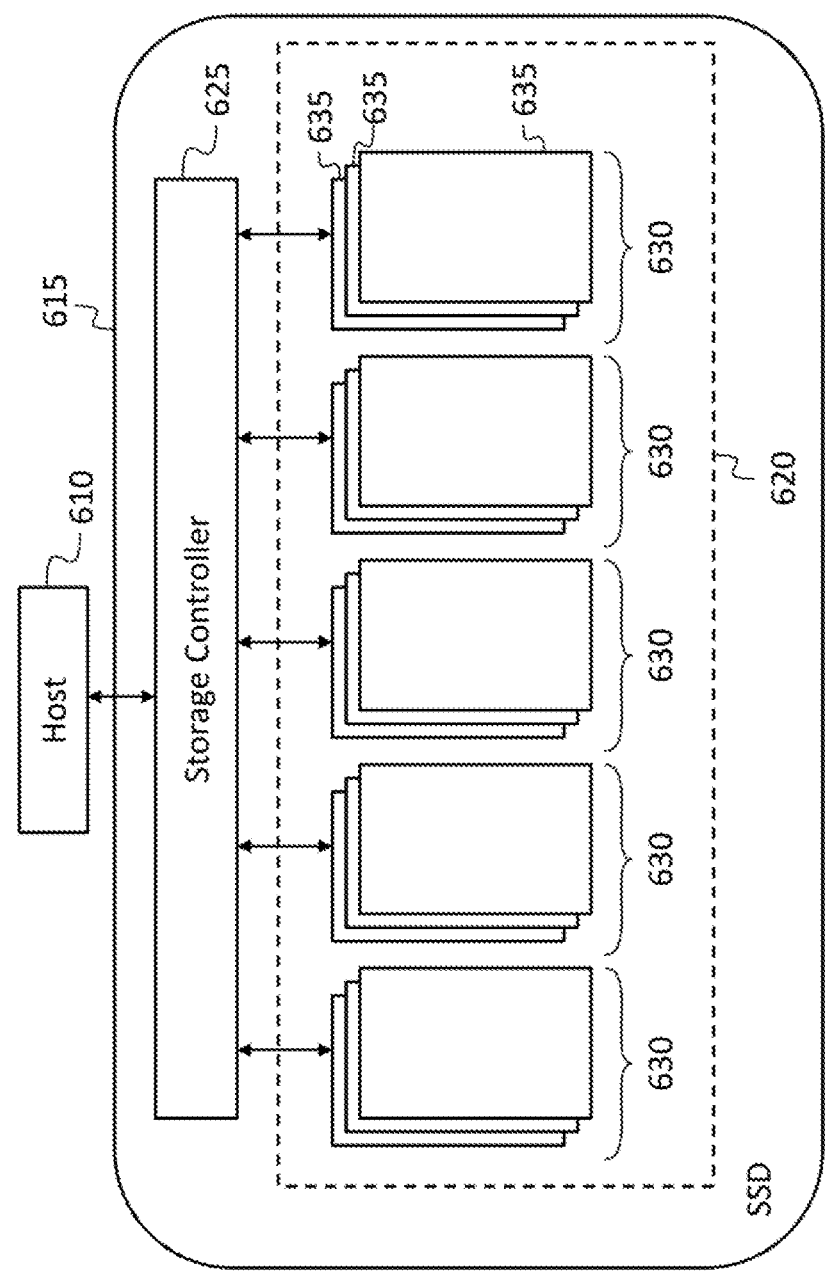
FIG. 6 is a block diagram of a host and a solid state drive, according to an embodiment of the present invention.

Referring to FIG. 6, in one embodiment a host 610 is connected to a solid state drive 615, and uses the solid state drive 615 for persistent storage. The solid state drive 615 may be a self-contained unit in an enclosure configured to provide persistent storage. It may be connected to the host 610 through a storage interface, e.g., through a connector and a protocol customarily used by a host 610 for storage operations. The connector and protocol may conform to, for example, Serial Advanced Technology Attachment (SATA), Fibre Channel, Serial Attached SCSI (SAS), Non Volatile Memory Express (NVMe), or to a more general-purpose interface such as Ethernet or Universal Serial Bus (USB). A flash memory 620 in the solid state drive 615 may be organized into physical flash memory blocks 630 (or "flash blocks" or "flash memory blocks") and physical pages 635. A physical flash memory block 630 may be the smallest unit of memory that is erasable in one operation, and a physical page 635 may be the smallest unit of memory that can be written in one operation. Each physical flash memory block 630 may include a plurality of physical pages 635. The host may interact with the mass storage device with storage access requests directed to logical page numbers, e.g., requesting data stored in a page at a logical page number, requesting that data be written to a page at a logical page number, or requesting that data stored in a page at a logical page number be erased. For SSDs, static logical to physical (L-P) mappings are not used since the difference in read/write and erase sizes dictates a garbage control mechanism that is constantly moving data from one physical location to another, hence the need for a dynamic L-P map.

A flash translation layer may translate or map logical page numbers dynamically into physical page numbers. When new data is to be overwritten over data in a page at a logical page number, the flash translation layer may then mark the physical page 635 currently corresponding to the logical page number as invalid (instead of erasing the physical flash memory block 630 containing this physical page 635), update the mapping from logical page numbers to physical pages 635 to map the logical page number to a new physical page 635, and write the new data into the new physical page 635. The flash translation layer may be implemented in software running on a storage controller 625 (e.g., a microcontroller) in the solid state drive 615. Data received from the host for programming into the flash memory may be encoded with an error correcting code, and when data are read from the flash memory, the raw data read may be processed with an error correcting code decoding operation, which may produce both the decoded data with errors corrected, and a bit error count, i.e., a count of the number of bit errors that were corrected by the error correcting code decoding operation.

Occasionally the flash translation layer may perform an operation referred to as "garbage collection". In this operation, any physical flash memory block 630 that contains a large proportion (e.g., a proportion exceeding a set threshold) of physical pages 635 that have been marked as invalid may be erased, after the valid physical pages 635 remaining in the physical flash memory block 630 have been moved to physical pages 635 in one or more other physical flash memory blocks 630, causing the newly erased physical flash memory block 630 to be available for writing of new data.

A plurality of applications may run (e.g., execute) in the host 610 and may generate input/output (I/O) requests (e.g., erase requests, programming (write) requests, and read requests), that may be transmitted to the solid state drive 615. Each such application may have requirements on the characteristics of persistent storage, e.g., requirements specifying the maximum acceptable average response time and the minimum allowable retention time. In some embodiments, each application may have multiple I/O streams which may in turn also have requirements on the characteristics of persistent storage. Thus, each application may include multiple sets of requirements. In some embodiments, these requirements are used by the solid state drive 615 to determine which physical flash memory blocks 630 may be used for storing data for an application, and to select, for example, a step size to be used when writing data for the application. Each application may, when it starts, register with the solid state drive 615, identifying itself to the solid state drive 615 and sending its storage requirements to the solid state drive 615. In this manner, the solid state drive 615 may insure that input/output requests generated by any application are handled in a manner meeting the requirements of that application. The quality, of the solid state drive 615, of responding adaptively to input/output requests in accordance with applicable requirements, is referred to herein as "morphic".

As discussed above, as the solid state drive 615 ages, the performance of the drive also diminishes. In some instances, the solid state drive 615 may not wear evenly, resulting in some portions of the drive having a lower performance than other portions of the drive. For example, one or more physical pages 635 and/or physical flash memory block 630 may degrade faster, than other physical pages and physical flash memory blocks 630. Thus, one or more physical pages 635 may become low performance, causing a physical flash memory block 630 containing the physical pages 635 to also become low performance. Similarly, other physical pages 635 and other physical flash memory blocks 630 may maintain a higher performance. In some embodiments, the quality of a solid state drive 615 may be maintained by no longer utilizing the lower performing sections of the drive in the same manner as the higher performing sections. Thus, the overall capacity or performance of the solid state drive 615 may be reduced to maintain the overall performance of the drive.

Figure 7:
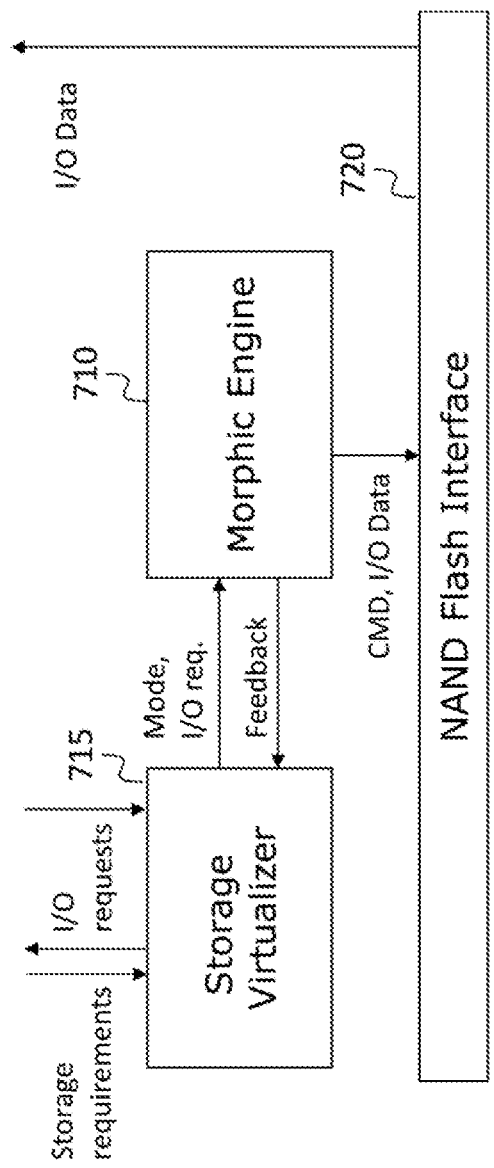
FIG. 7 is a block diagram of a morphic system, according to an embodiment of the present invention.

Referring to FIG. 7, in some embodiments, a morphic engine 710 and storage virtualizer 715 in the storage controller 625 may be employed to allocate flash memory to applications, upon request from the applications. The morphic engine 710 may connect to the flash interface 720 to handle input output (I/O) requests sent by the applications via the storage virtualizer 715.

Figure 8:
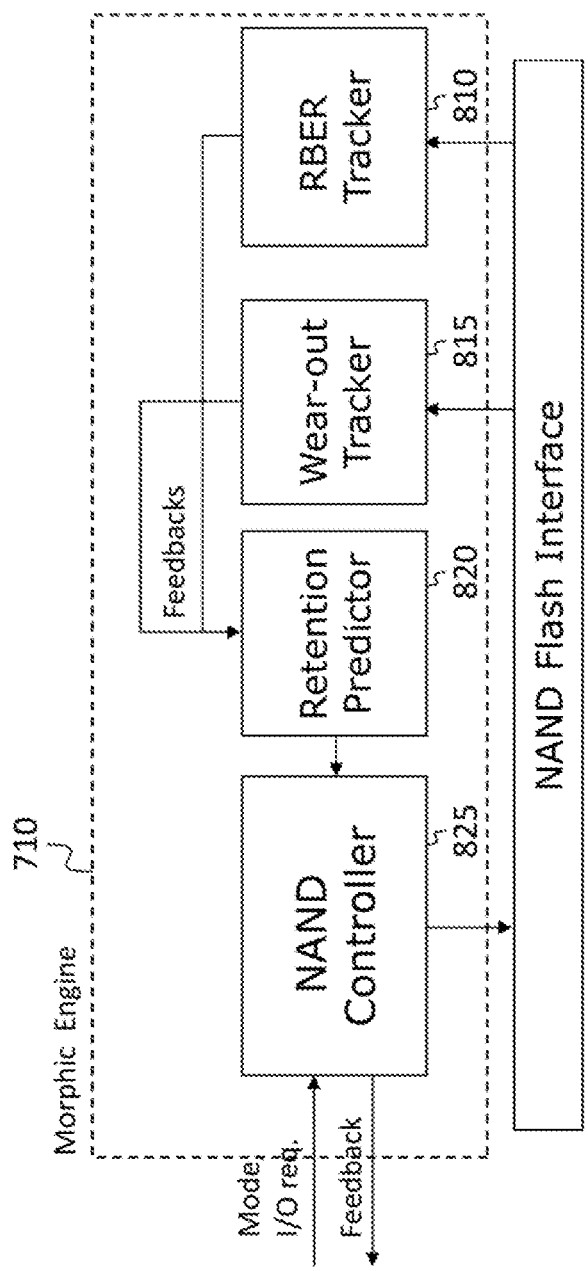
FIG. 8 is a block diagram of a morphic engine, according to an embodiment of the present invention.

Referring to FIG. 8, in some embodiments, the morphic engine 710 includes a raw bit error rate (RBER) tracker 810, a wear-out tracker 815, a retention predictor 820, and a NAND controller 825. The raw bit error rate tracker 810 monitors the raw bit error rate of each physical flash memory block 630. The raw bit error rate tracker 810 may accomplish this by tracking the bit error count each time data are read from the flash memory in response to host requests. In some embodiments the bit error count is recorded as an extra entry in the flash translation layer. The raw bit error rate tracker 810 may also perform "sampling" read operations (i.e., read operations not resulting from host requests) to obtain an updated measurement of the raw bit error rate in a physical flash memory block 630 when, for example, no host-requested read operations have been performed in the physical flash memory block 630 in some time. In this manner, the raw bit error rate tracker 810 may, over time, create a table listing for each physical flash memory block 630 the bit error rate observed. In some embodiments the table has multiple entries for each physical flash memory block 630, e.g., a first observed raw bit error rate for memory cells that were programmed with incremental step pulse programming using a large step size, and a second observed raw bit error rate for memory cells that were programmed with incremental step pulse programming using a small step size. The table may be stored in nonvolatile memory (e.g., in the flash memory 620) so that it is preserved if power to the solid state drive 615 is temporarily interrupted.

The wear-out tracker 815 monitors the programming and erase operations performed on the flash memory and counts the number of programming and erase cycles performed for each physical flash memory block 630. In some embodiments the number of programming and erase cycles performed is tracked, in the flash translation layer, for wear-leveling purposes also. In this manner, the wear-out tracker 815 may, over time, create a table that lists (for each physical flash memory block 630) the number of programming and erase cycles that have been performed on the physical flash memory block 630. In some embodiments the table has multiple entries for each physical flash memory block 630, e.g., a count of programming and erase cycles performed using a shallow erase process and a separate count of programming and erase cycles performed using a normal erase process. The table may be stored in nonvolatile memory (e.g., in the flash memory 620) so that it is preserved if power to the solid state drive 615 is temporarily interrupted.

The retention predictor 820 is used to estimate the allowable retention time of each physical flash memory block 630 for each of a variety of erase and programming methods. In one embodiment, the retention predictor performs a linear fit (or as an exponential fit) to the bit error rate as a function of retention time (as reported by the raw bit error rate tracker 810) and calculates the allowable retention time as the value of the retention time at which the raw bit error rate of this fit is equal to a threshold, i.e., maximum acceptable raw bit error rate, which may be one bit error per million bits. In some embodiments the threshold is a programmable variable.

The NAND controller 825 is a driver routine that interacts directly with the flash memory 620, issuing block and page level read, write, and erase commands. It includes the error correcting code decoding algorithm that detects and corrects bit errors in the raw data read from the flash memory 620. The NAND controller 825 also relays information from the retention predictor 820 to the storage virtualizer 715. The NAND controller further provides control over the erase process (e.g., whether a shallow or normal erase is used) and the programming process (e.g., the step size to be employed in a programming operation employing incremental step pulse programming).

Figure 9:
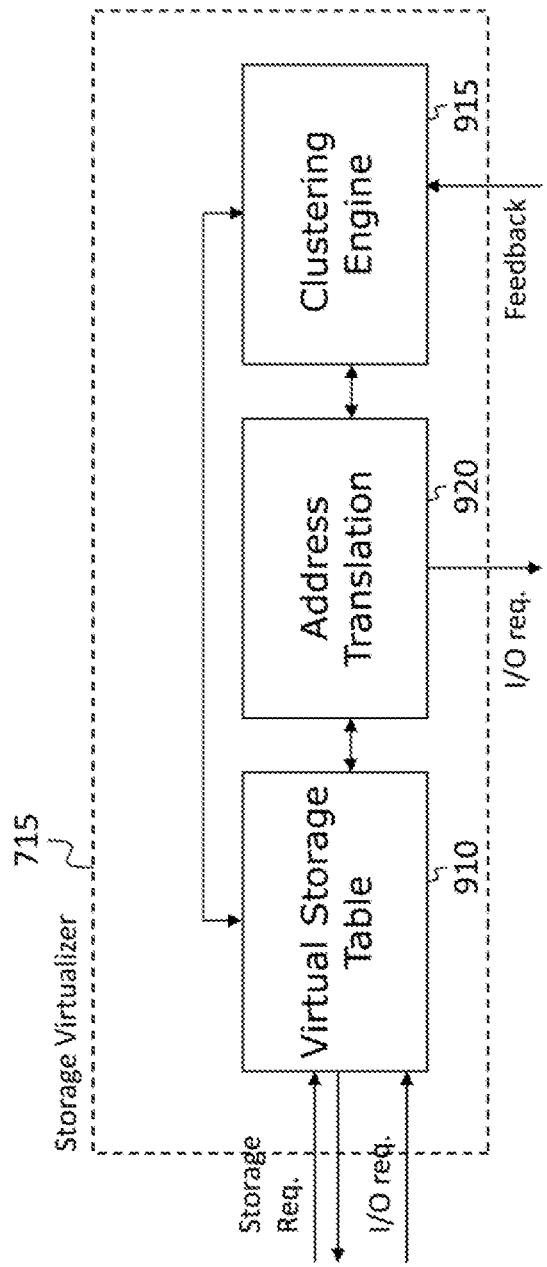
FIG. 9 is a block diagram of storage virtualizer, according to an embodiment of the present invention.

Referring to FIG. 9, in the storage virtualizer 715, a virtual storage table 910 stores, for each application registered with the solid state drive 615, a set of requirements, indicating, for example, the maximum acceptable average response time and the minimum acceptable allowable retention time. The requirements may also include a capacity requirement, indicating how many blocks will potentially be used by the application. A clustering engine 915 receives this information from the virtual storage table 910 and generates a cluster list for each application registered with the solid state drive 615, the cluster being a set of physical flash memory blocks 630 suitable for meeting the requirements of the respective application, according to the retention predictor 820, and the corresponding cluster list being a list of the physical flash memory blocks 630 in the cluster. An address translation block 920 (which may be part of the flash translation layer) maintains a cross reference table mapping logical page addresses to physical page addresses in the flash memory 620 (FIG. 6). Each time a physical flash memory block 630 that is a member of one or more clusters is erased, the clustering engine re-assesses whether it remains eligible for membership in the clusters (eligibility potentially having been affected by the additional programming and erase cycle) and updates the clusters, and cluster lists, accordingly.

A physical flash memory block 630 is deemed eligible for membership in a cluster when it is suitable for meeting the requirements of the application corresponding to the cluster, i.e., when for some programming method (e.g., for some step size to be used in incremental step pulse programming), both the average response time requirement and the allowable retention time requirement of the application are met concurrently or simultaneously. If an application has requirements that are too stringent for any of the physical flash memory blocks 630 available, then one or more physical flash memory blocks 630 that most closely meet the requirements may nonetheless be deemed eligible for membership in a cluster for the application. In this situation the application may be alerted that physical flash memory blocks 630 not meeting its requirements are being allocated to it. This determination is made given the history of programming and erase cycles the physical flash memory block 630 has undergone, including, if it is freshly erased, whether the most recent erasure was performed using a shallow erase process or a normal erase process. In some embodiments, during garbage collection, the erasure of a block being recycled by garbage collection may be postponed until the block is allocated to a particular application.

In this embodiment the clustering engine includes the block in a cluster when, if erased using a normal erase, it would be suitable for meeting the requirements of the application corresponding to the cluster. After the block is allocated to an application, it is erased using a shallow erase if a shallow erase is sufficient to allow it to meet the requirements of the application; otherwise it is erased using a normal erase.

In operation, when an application makes a request for an allocation of persistent storage, the request is received by the virtual storage table, which makes a request to the clustering engine for a list of one or more eligible physical flash memory blocks 630, i.e., physical flash memory blocks 630 meeting the requirements of the application. The address translation block 920 then allocates the storage requested by the application within one or more of the eligible physical flash memory blocks 630 and updates the mapping from logical page numbers to physical page numbers. When the application subsequently writes data to the solid state drive 615, the programming is performed using programming parameters consistent the application's requirements (e.g., incremental step pulse programming with a step size that is sufficiently large to meet the average response time requirement and sufficiently small to meet the allowable retention time requirement).

Figure 10A:
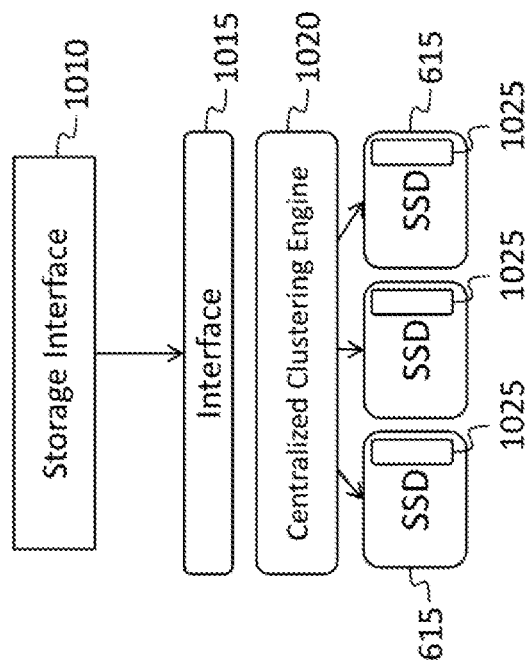
FIG. 10A is a block diagram of a system with a plurality of thin clustering engines, according to an embodiment of the present invention.
Figure 10B:
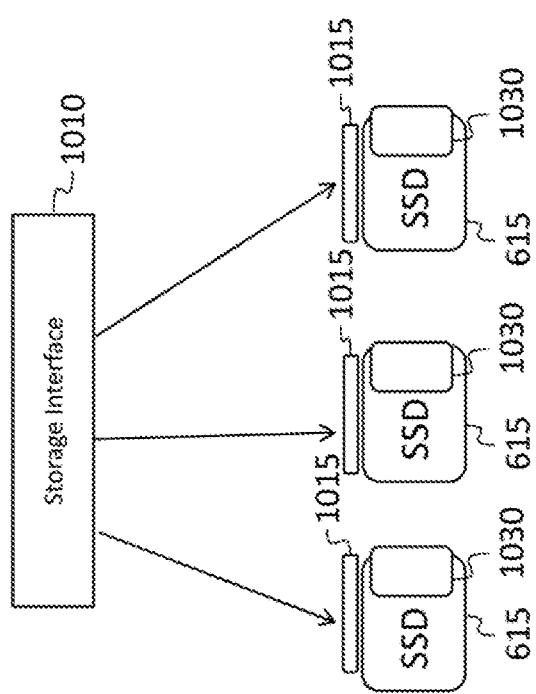
FIG. 10B is a block diagram of a system with a plurality of thick clustering engines, according to an embodiment of the present invention.

Referring to FIGS. 10A and 10B, in some embodiments, a plurality of solid state drives 615 may be connected together, to form a logical storage layer providing storage to the host 610. In such an embodiment, it may be helpful for the clustering information to be shared so that storage allocation decisions may be made accordingly. For example in FIG. 10A, if an application makes an allocation request (through the storage interface 1010 and the second interface 1015) for a large amount of storage, the centralized clustering engine 1020, which maintains copies of cluster lists generated by the respective thin clustering engines 1025 of the solid state drives 615, may allocate space from one or more eligible physical flash memory blocks 630 in one or more of the solid state drives 615. In the embodiment of FIG. 10B, each solid state drive 615 includes a thick clustering engine 1030, which maintains, in addition to its own cluster list, a copy of the cluster lists of each of the other thick clustering engines 1030. In this embodiment when a solid state drive 615 receives an allocation request (through the storage interface 1010 and the second interface 1015) for an amount of storage exceeding the amount available within the eligible physical flash memory blocks 630 of the solid state drive 615, it propagates the request for the unmet allocation requirement to another solid state drive 615 (which, in turn, propagates the request for the unmet allocation requirement to another solid state drive 615 if it cannot accommodate the request).

Figure 11A:
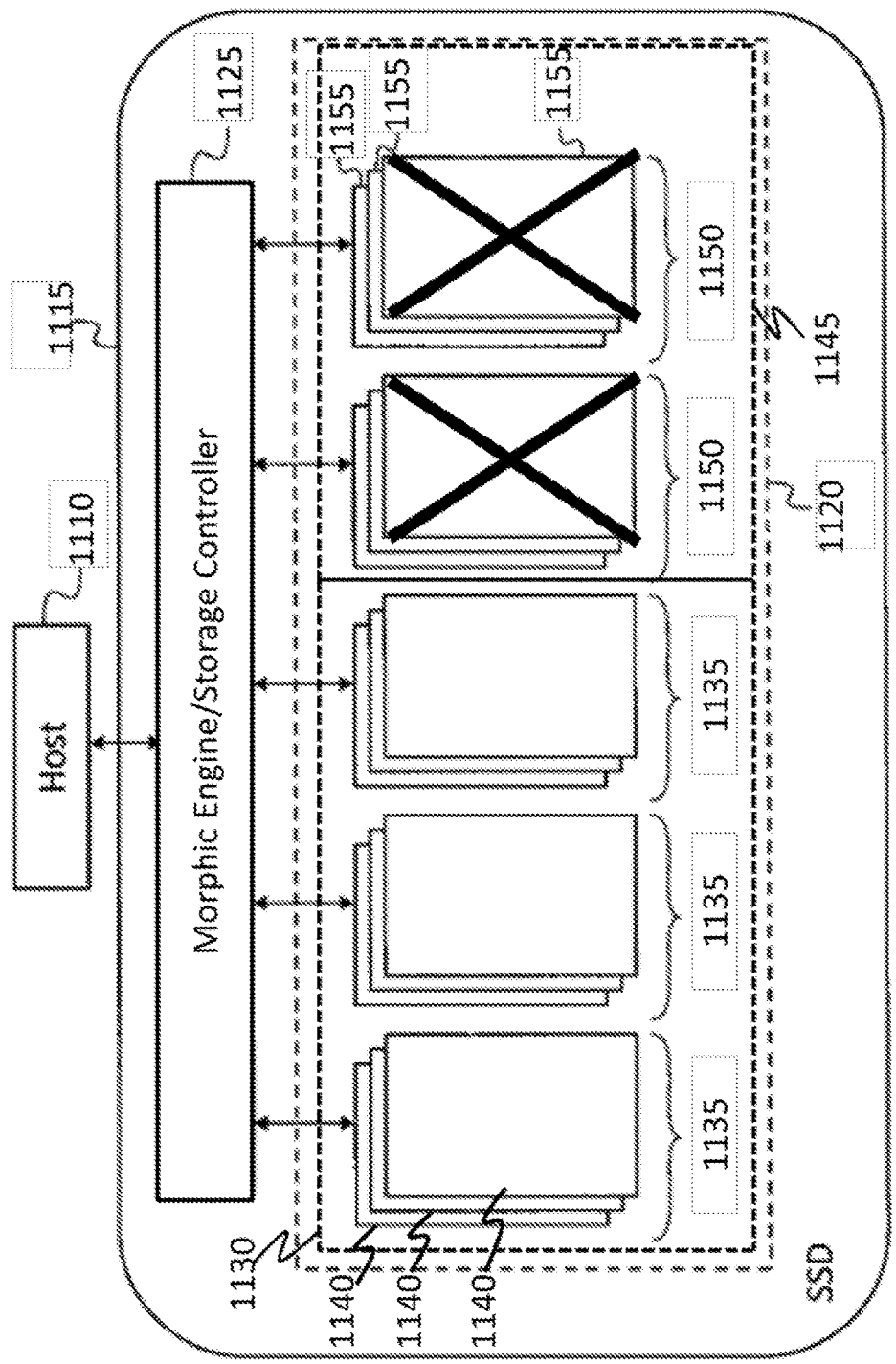
FIG. 11A is a block diagram of a morphic system, according to an embodiment of the present invention.
Figure 11B:
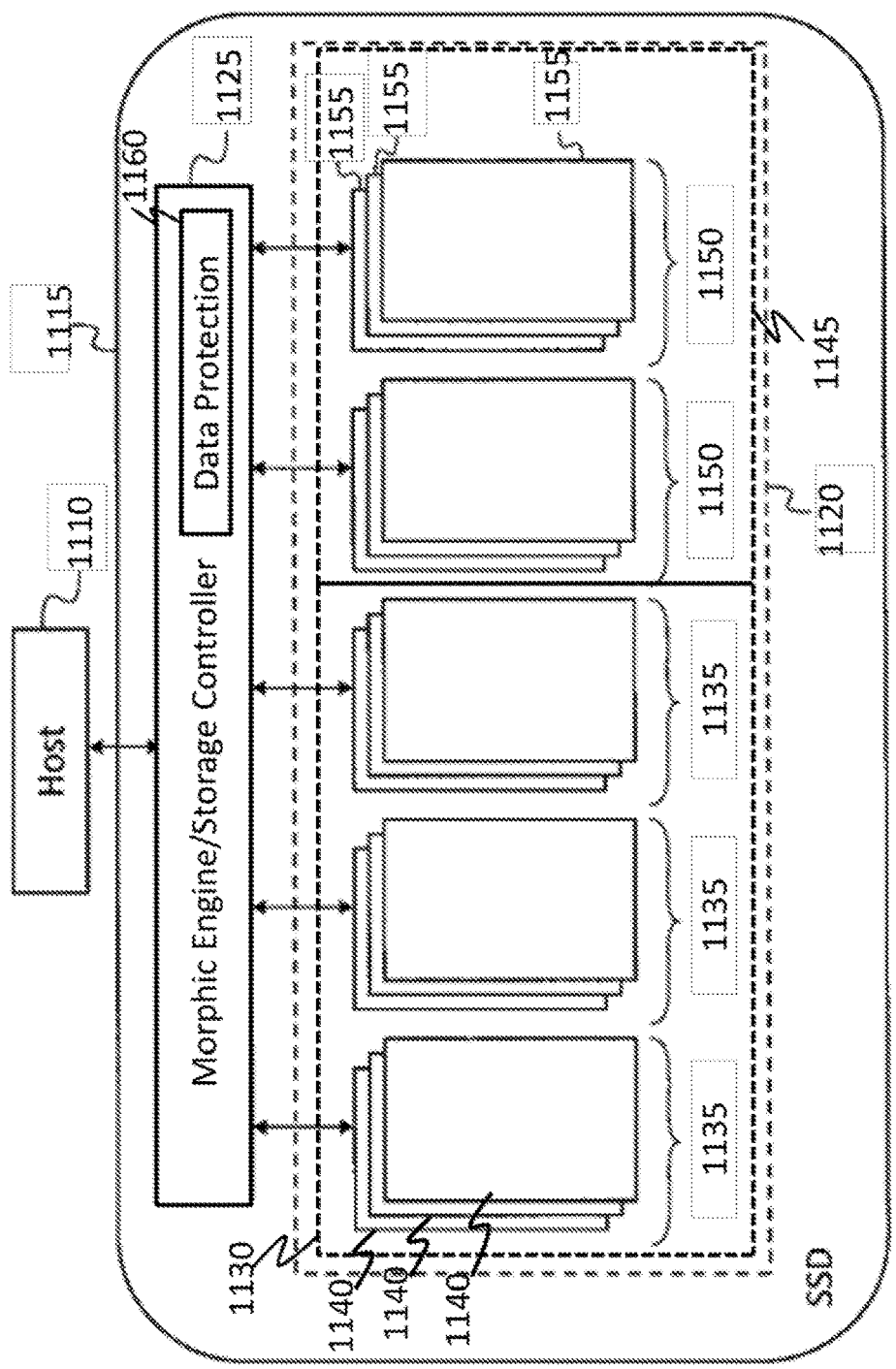
FIG. 11B is a block diagram of a morphic system, according to an embodiment of the present invention.

Referring to FIGS. 11A and 11B, similar to the drive described above with reference to FIG. 6, in some embodiments, a solid state drive 1115 may be a self-contained unit in an enclosure configured to provide persistent storage and may be connected to the host 1110 through a storage interface with the storage controller 1125. As discussed above with reference to FIG. 7, the storage controller 1125 may include a morphic engine for responding adaptively to input/output requests in accordance with applicable requirements. The morphic engine may also include a raw bit error rate (RBER) tracker, a wear-out tracker, and a retention predictor for assessing the performance of portions of a drive. For example, the morphic engine may be configured to monitor the performance characteristics of physical pages 1140, 1155 and memory blocks 1135, 1150.

Over time, the morphic engine is able to track the current life status or age of the drive. Despite attempts to cause a drive 1115 to wear evenly, in some case different physical pages 1140, 1155, and memory blocks 1135, 1150 may age at different rates. For example, the physical pages 1155 and memory blocks 1150 may have worn faster than physical pages 1140 and memory blocks 1135. In some instances, the physical pages a 1155 and memory blocks 1150 may now have slower response times, higher BER, and/or relatively poorer retention when compared to the relatively younger physical pages 1140 and memory blocks 1135. Thus, the drive as a whole 1115 may no longer be able to perform in within the parameters of some applications (e.g., maximum acceptable average response time, the minimum allowable retention time etc.).

In various embodiments, the storage controller 1125 may utilize age information to extend the life of the drive 1115. For example, in some embodiments, the storage controller 1115 may stop using the poor performing (e.g., "old") memory blocks 1155 and physical pages 1150. By abandoning the usage of or only selectively using the poor performing storage space, the overall performance of the drive 1115 can be increased at the expense of a reduced capacity.

Referring to FIG. 11B, in various embodiments, the storage controller 1115 may perform various data protection techniques to increase the longevity of the drive 1115 by increasing the performance of the poor performing (e.g., "old") memory blocks 1155 and physical pages 1150. For example, the storage controller 1115 may include a data protection controller 1160 configured to apply a data protection scheme on lower performing (e.g., "old") portions of the drive 1115 and prolong their usability. For example, the data protection controller 1160 may include a Redundant Array of Independent Disks (RAID) controller. In various embodiments, the data protection controller 1160 may implement RAID to compensate for the age of the drive or portions of the drive by providing better data security, performance, and/or data retention. For example, if a portion of the drive is performing too slowly (e.g., has a slow average response time), RAID 0 may be implemented to stripe data across multiple underperforming pages 1150 to increase performance. In other embodiments, parity (and data striping) may be introduced by implementing RAID 1, RAID 5, or other type or RAID to compensate for BER, access times, or other age-related issues on lower performing portions of the drive (e.g., the memory blocks 1155 and physical pages 1150). Using a RAID configuration with parity may also allow for an increase in the estimated allowable retention time for the pages 1150. In some embodiments, erasure coding may be used to create parity bits to increase data security and compensate for the issues related to drive age. For example, the data protection controller 1160 may implement erasure coding on the older (e.g., lower performing) portions of the drive (e.g., pages 1150 and memory blocks 1155) to improve their performance and suitability for continued use. Thus, by using a data protection controller 1160, the drive 1115 may maintain a similar reliability across the drive's lifespan.

In light of the foregoing, a solid state drive may meet storage requirements of various applications and/or streams efficiently by adjusting erase and programming parameters, and selecting physical flash memory blocks 630/1135, 1155, tailored to the requirements of the application. In this manner, for example, long retention time may be provided to applications requiring long retention time, and shorter retention time may be provided, with, e.g., a corresponding improvement in performance, to applications requiring only a shorter retention time.

The solid state drive 615/1115 and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the solid state drive 615 may be formed on one integrated circuit (IC) chip or on separate IC chips. Further, various components of the solid state drive 615/1115 may be implemented on a flexible printed circuit film, a tape carrier package (TCP), a printed circuit board (PCB), or formed on a same substrate as the solid state drive 615/1115. Further, various components of the solid state drive 615/1115 may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

The storage controller 625/1125 may be, or include, a processing circuit. The term "processing circuit" is used herein to include any combination of hardware, firmware, and software, employed to process data or digital signals. Processing circuit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing circuit, as used herein, each function is performed either by hardware configured, i.e., hard-wired, to perform that function, or by more general purpose hardware, such as a CPU, configured to execute instructions stored in a non-transitory storage medium. A processing circuit may be fabricated on a single printed wiring board (PWB) or distributed over several interconnected PWBs. A processing circuit may contain other processing circuits; for example a processing circuit may include two processing circuits, an FPGA and a CPU, interconnected on a PWB.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" means a component constituting at least half, by weight, of a composition, and the term "major portion", when applied to a plurality of items, means at least half of the items.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although example embodiments of a morphic storage device have been specifically described and illustrated herein, many modifications and variations will be apparent to those skilled in the art. Accordingly, it is to be understood that a morphic storage device constructed according to principles of this invention may be embodied other than as specifically described herein. The invention is also defined in the following claims, and equivalents thereof.

What is claimed is:

1. A method for allocating portions of a flash memory in a solid state drive connected to a host, the flash memory comprising a plurality of physical flash memory blocks, the method comprising:
    counting a number of programming and erase cycles performed for each of the plurality of physical flash memory blocks;
    calculating, for one or more physical flash memory blocks, from a raw bit error rate and the number of programming and erase cycles, for each of a plurality of programming methods:
        an average response time, and
        an estimated allowable retention time;
    receiving, from a first application executing on the host, a first set of requirements;
    determining, for one or more physical flash memory blocks, whether it is suitable for meeting the first set of requirements;
    receiving a request for an allocation of storage space from the first application; and
    allocating, to the first application, a first physical flash memory block that is suitable for meeting the first set of requirements.

2. The method of claim 1, further comprising:
    performing a plurality of read operations on the flash memory, one or more read operations comprising an error correcting code decoding operation, the error correcting code decoding operation producing a bit error count; and
    calculating, from a plurality of bit error counts, the raw bit error rate for one or more of the plurality of physical flash memory blocks.

3. The method of claim 1, further comprising:
    forming a first list of physical flash memory blocks, the physical flash memory blocks in the first list being suitable for meeting the first set of requirements,
    wherein allocating, to the first application, the first physical flash memory block that is suitable for meeting the first set of requirements comprises, allocating, to the first application, the first physical flash memory block from the first list.

4. The method of claim 3, further comprising:
    receiving, from a second application executing on the host, a second set of requirements different from the first set of requirements;
    determining, for one or more physical flash memory blocks, whether it is suitable for meeting the second set of requirements;
    forming a second list of physical flash memory blocks, the physical flash memory blocks in the second list being suitable for meeting the second set of requirements;
    receiving a request for an allocation of storage space from the second application; and allocating, to the second application, a second physical flash memory block from the second list.

5. The method of claim 1, wherein the plurality of programming methods comprises:
 a first programming voltage; and
 a second programming voltage, the second programming voltage being greater than the first programming voltage.

6. The method of claim 1, wherein the first set of requirements includes a required allowable retention time or a required average response time.

7. The method of claim 6, wherein the determining, for one or more physical flash memory blocks, whether it is suitable for meeting the first set of requirements comprises determining whether for any programming method of the plurality of programming methods:
 the calculated average response time is less than the required average response time; and
 the calculated estimated allowable retention time is greater than the required allowable retention time.

8. The method of claim 1, further comprising improving at least one of the average response time or the estimated allowable retention time by performing data protection on at least one of the plurality of physical flash memory blocks.

9. The method of claim 8, wherein performing data protection comprises performing according to one of a redundant array of independent disks (RAID) configuration or an erasure coding configuration.

10. A solid state drive, comprising:
 a storage controller, the storage controller comprising a hardware processing circuit; and
 a flash memory, including a plurality of physical flash memory blocks, each physical flash memory block comprising a plurality of physical pages,
 the storage controller comprising:
  a morphic engine comprising:
   a NAND controller;
   a retention predictor;
   a wear-out tracker;
   a raw bit error rate tracker; and
   a data protection controller; and
  a storage virtualizer comprising:
   an address translation block; and
   a clustering engine;
 the raw bit error rate tracker being configured to calculate, from a plurality of bit error counts, a raw bit error rate for one or more of the plurality of physical flash memory blocks;
 the wear-out tracker being configured to count programming and erase cycles performed for one or more of the plurality of physical flash memory blocks;
 the clustering engine being configured to calculate, for one or more physical flash memory blocks, from the raw bit error rate and a number of programming and erase cycles for each of a plurality of programming methods:
  an average response time, and
  an estimated allowable retention time;
 the data protection controller being configured to improve at least one of the average response time or the estimated allowable retention time by implementing a data protection scheme;
 the clustering engine being configured to receive a first set of requirements, and to determine, for one or more physical flash memory blocks, whether it is suitable for meeting the first set of requirements;
 the clustering engine being configured to receive a request for an allocation of storage space from a first application; and
 the clustering engine being configured to allocate, to the first application, a first physical flash memory block that is suitable for meeting the first set of requirements.

11. The solid state drive of claim 10, wherein the NAND controller is configured to perform a plurality of read operations on the flash memory, one or more read operations comprising an error correcting code decoding operation, the error correcting code decoding operation producing the bit error count.

12. The solid state drive of claim 10, wherein the clustering engine is configured to form a first list of physical flash memory blocks, the physical flash memory blocks in the first list being suitable for meeting the first set of requirements, and is configured to allocate, to the first application, the first physical flash memory block that is from the first list.

13. The solid state drive of claim 10, wherein the storage virtualizer further comprises a virtual storage table, the virtual storage table being configured to receive, from a first application executing on a host, the first set of requirements for a first data stream, and wherein the clustering engine being configured to receive the first set of requirements from the virtual storage table.

14. The solid state drive of claim 13, wherein:
 the virtual storage table is further configured to receive, from the first application executing on the host, a second set of requirements different from the first set of requirements associated with a first application stream;
 the clustering engine is further configured to:
  receive the second set of requirements from the virtual storage table, and to determine, for one or more physical flash memory blocks, whether it is suitable for meeting the second set of requirements;
  form a second list of physical flash memory blocks, the physical flash memory blocks in the second list being suitable for meeting the second set of requirements;
  receive a request for an allocation of storage space from the first application; and
  allocate, to the first application, a second physical flash memory block from the second list.

15. The solid state drive of claim 10, wherein the plurality of programming methods comprises:
 a first programming voltage; and
 a second programming voltage, the second programming voltage being greater than the first programming voltage.

16. The solid state drive of claim 10, wherein the first set of requirements includes a required allowable retention time or a required average response time.

17. The solid state drive of claim 16, wherein the determining, for one or more physical flash memory blocks, whether it is suitable for meeting the first set of requirements comprises determining whether for any programming method of the plurality of programming methods:
 the calculated average response time is less than the required average response time; and
 the calculated estimated allowable retention time is greater than the required allowable retention time.

18. The solid state drive of claim 10, wherein the data protection controller is configured to provide one of redundant array of independent disks (RAID) operation or an erasure coding operation to at least one physical flash memory block of the plurality of physical flash memory blocks.

19. A method for allocating portions of a flash memory in a solid state drive connected to a host, the flash memory comprising a plurality of physical flash memory blocks, the method comprising:
- counting a number of programming and erase cycles performed for each of the plurality of physical flash memory blocks;
- calculating, for one or more physical flash memory blocks, from a raw bit error rate and the number of programming and erase cycles:
  - an average response time, and
  - an estimated allowable retention time;
- receiving, from a first application executing on the host, a first set of requirements for a first data stream;
- determining, for one or more physical flash memory blocks, whether it is suitable for meeting the first set of requirements based on the corresponding average response time and the estimated allowable retention time;
- receiving a request for a first allocation of storage space from the first application; and
- allocating, to the first application, a first physical flash memory block that is suitable for meeting the first set of requirements.

20. The method of claim 19, further comprising:
- receiving, from the first application executing on the host, a second set of requirements for a second data stream;
- determining, for one or more physical flash memory blocks, whether it is suitable for meeting the second set of requirements based on the corresponding average response time and the estimated allowable retention time;
- receiving a request for a second allocation of storage space from the first application; and
- allocating, to the first application, a second physical flash memory block that is suitable for meeting the second set of requirements.

* * * * *